(12) United States Patent
Sajna et al.

(10) Patent No.: US 6,386,023 B1
(45) Date of Patent: May 14, 2002

(54) SENSOR FOR INCREASING SIGNAL RESPONSE TIME

(75) Inventors: Jeffrey L. Sajna, St. Charles; Richard C. Barthel, Libertyville, both of IL (US); David J. Gardner, Farmington Hills, MI (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 09/275,556

(22) Filed: Mar. 24, 1999

(51) Int. Cl.[7] .................................................. G01M 9/00
(52) U.S. Cl. ........................ 73/146; 73/147; 73/862.637
(58) Field of Search ................... 73/818–825, 862.621, 73/862.622, 862.632, 862.636, 862.637, 147, 146

(56) References Cited

U.S. PATENT DOCUMENTS

| | | |
|---|---|---|
| 3,778,823 A * 12/1973 | Sato et al. | 343/7 |
| 4,799,381 A    1/1989 | Tromp | 73/146 |
| 4,825,967 A * 5/1989 | Sakamoto et al. | 177/210 |
| 4,869,107 A    9/1989 | Murakami | 73/517 |
| 5,010,972 A    4/1991 | Ingraham et al. | 180/178 |
| 5,137,338 A    8/1992 | Ingraham | 303/3 |
| 5,281,780 A * 1/1994 | Haland | 200/52 |
| 5,435,409 A    7/1995 | Meyer et al. | 180/274 |
| 5,477,942 A   12/1995 | Shea et al. | 187/395 |
| 5,624,132 A * 4/1997 | Blackburn et al. | 280/735 |

FOREIGN PATENT DOCUMENTS

| | | | |
|---|---|---|---|
| EP | 0 501 555 B1 | 12/1997 | B60Q/1/44 |
| JP | 02219404 | 2/1989 | B60L/7/14 |

* cited by examiner

Primary Examiner—Benjamin R. Fuller
Assistant Examiner—Jewel V. Thompson
(74) Attorney, Agent, or Firm—Rader Fishman & Grauer PLLC

(57) ABSTRACT

A sensor (210) for increasing signal time employs a resiliently deflectable member n(218) with a pressure sensitive signal element (216) and base member (222). The dampening effect of the elastic material provides a longer signal response time that allows sufficient time for a system to react without a need for additional signal conditioning circuitry. Sensor (10, 110) senses a selected path of movement for a moveable element (8) and establishes a signal indicative thereof. The limit sensor includes a resiliently deflectable member (18) for activating the signal at a predetermined station along the preselected path of movement and includes a base member (22) for supporting the resiliently deflectable member (18) and the pressure sensitive signal element (16). An actuator (20) receives the force (F) from the moveable element (8) and transfers the force (F) to the pressure sensitive signal element (16). In the preferred embodiment, the resiliently deflectable member (18) includes a leaf spring (18) positioned between the actuator (20) and the pressure sensitive signal element (16).

27 Claims, 3 Drawing Sheets

SENSOR FOR INCREASING SIGNAL RESPONSE TIME

CROSS-REFERENCE TO RELATED APPLICATIONS

Not Applicable

STATEMENT REGARDING FEDERALLY SPONSORED RESEARCH OR DEVELOPMENT

Not Applicable

MICROFICHE APPENDIX

Not Applicable

BACKGROUND OF THE INVENTION

1. Field of the Invention

The present invention relates in general to a sensing device and method, and more particularly to a sensor and method for increasing signal response time. The present invention also relates to a limit sensor or a switch for sensing travel of a moveable element on a selected path of movement.

2. Description of the Related Art

Compression or force sensitive resistors are commercially available for a variety of applications. A force sensitive resistor normally resists the flow of electrical current, but permits the flow of electrical current in proportion to pressure applied to the resistor. As the resistor is compressed, it becomes less resistant to the flow of current so that the current flow may be measured by a suitable detector which indicates the application and the amount of pressure thereon. A force sensitive resistor may be made of an elongated printed circuit strip having electrically conductive strips printed upon a nonconductive substrate. The conductive strips terminate in two electrical terminals or leads. An electrically resistive film or layer is applied thereon such that the resistive film lies across and against the conductive strips. As a force is applied against the resistive film, the electrical resistance decreases between the terminals. Polymer thick film (PTF) resistors are commercially available from a variety of suppliers including Eaton Corporation for example.

U.S. Pat. No. 4,799,381 describes the use of a force sensing resistor embedded in a resilient, rubber like strip as a vehicle road and/or weight sensor.

Other vehicle applications for such sensors include applying a force sensitive resistor in a vehicular braking system for creating output signals to a logic circuit as disclosed in U.S. Pat. No. 5,010,972.

U.S. Pat. No. 5,435,409 discloses the use of a force sensing resistor functioning as a deformation sensor as a safety device for the protection of vehicle occupants against a side-on collision.

Still another application for a force sensing resistor is as an electronic push button assembly useful in elevator controls as described in U.S. Pat. No. 5,477,942.

In some applications, for example, when a door jamb switch is employed in a power sliding door system for a vehicle, the vehicle controller or processor requires that a signal be sent to engage the hold open latch on the door. The door strikes the door bumper as it reaches its end of travel when it opens and applies a force, and then typically rebounds. The time that the door was in contact with the bumper is often too short for the processor to receive and recognize the signal. After rebound, the end of travel switch could be in an inactive state. When the operator wishes to close the sliding door, one of the command switches is depressed or activated. If the processor does not know the state of the door, it defaults to opening the door. So, the processor sends a command signal to the door module to open the sliding door which, will activate the end of travel switch which will engage the hold open latch. This will cause operator aggravation because the door will not close without the hold open latch being engaged.

While the signal time could be electrically lengthened using conventional electronic circuitry, there still exists a need for a sensor that increases the length of time of the impact force on the sensor, and transfers that force signal to the appropriate processor. Such a sensor should preferably stay activated during the complete cycle of movement including during any over travel or rebound effects. The sensor preferably should remain inactive (or open) when the door is closed. The sensor should signal the open/closed status of a power sliding door accurately to the vehicle processor. When the door is fully opened, the sensor would tell the processor that the door is open. To close the door would simply require input from the vehicle operator or occupant by way of a door activation switch on the instrument panel or other portion of the vehicle. Preferably, such a sensor will be a force sensitive resistor such as a proportional input device (PID) enclosed by a switch housing and actuator assembly. Also, the sensor would advantageously utilize the time delay effect due to rubber dampening.

While the sensor would be particularly suited for vehicle applications, such as end of travel of a moveable element and the status of that moveable element, it would also be useful in other applications. As an end-of-travel switch, it would assure latch engagement.

BRIEF SUMMARY OF THE INVENTION

The present invention is directed to solving the aforementioned problems as well as others by providing an improved sensor for increasing signal time by utilizing a dampening effect of an elastic material having a selected resiliency for providing a time delay in the signal. The present invention comprises an actuator having a resiliently deflectable member that receives a force from a moveable element and transfers the force to a pressure sensitive signal element. A base member supports the pressure sensitive signal element and the actuator. The selected resiliency of the resiliently deflectable member increases the signal time by using the dampening effect of the resilient material. In a preferred embodiment, this is used for "pulse stretching" a pulsed voltage signal.

The present invention is also directed to a limit sensor that comprises a pressure sensitive signal element operatively connected to a moveable element for receiving a force from the moveable element as it travels on its path of movement. The pressure sensitive signal element establishes a signal indicative of the force. A resiliently deflectable member activates the signal at a predetermined location along the path and applies a controlled force against the pressure sensitive signal element that is proportional to the input of the transferred force. A base member supports the resiliently deflectable member and the pressure sensitive signal element in the limit sensor according to the present invention.

An object of the present invention is to provide a sensor for increasing signal time with a selected resiliency of a resiliently deflectable member.

Another object of the present invention is to provide a sensor for increasing signal time with the use of an elastic material.

Another object of the present invention is to provide a sensor for increasing signal time with the use of a rubber material.

Another object of the present invention is to provide a method for increasing signal time by using a material having a selected resiliency to create a dampening for a time delay.

Another object of the present invention is to provide a limit sensor that functions as an end of travel switch.

Still another object of the present invention is to provide a limit sensor that functions as an end of travel switch for a power sliding door for a vehicle.

Still another object of the present invention is to provide a method of sensing the position of a moveable element.

Still another object of the present invention is to provide a method for sensing the state of a sliding door as it nears its end of travel.

Still another object of the present invention is to provide an improved sensor that is simple in design, rugged in construction, and economical to manufacture.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which a preferred embodiment of the invention is described and illustrated.

DETAILED DESCRIPTION OF THE INVENTION

Figure 1:
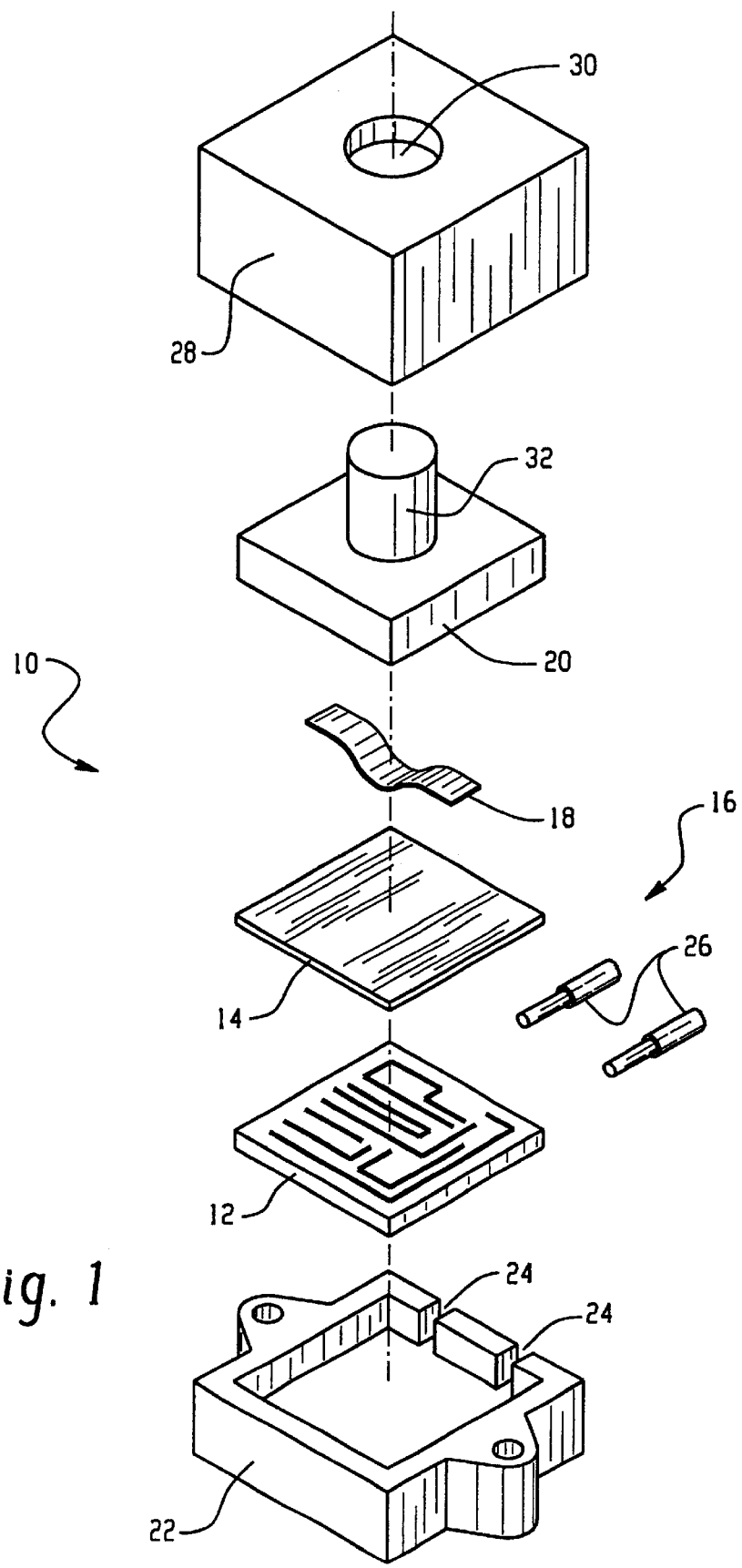
FIG. 1 is an exploded perspective view of one embodiment of the travel limit sensor in accordance with the present invention.
Figure 4:
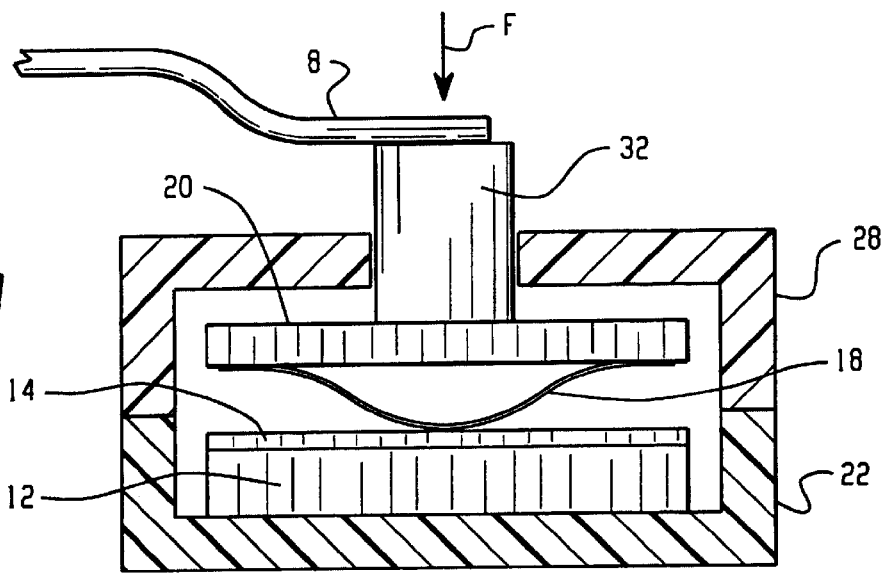
FIG. 4 is a sectional view of the embodiment shown in FIG. 1.

Referring to the figures generally, where like numerals designate like or similar features throughout the several views, and first to FIGS. 1 and 4, there is shown a limit sensor generally designated 10 in accordance with the present invention. Sensor 10 has a pressure sensitive signal element 16 which includes a non-conductive substrate 12 upon which a printed circuit coating or pattern is applied and a polymer thick film (PTF) layer 14 which is conductive. Layer 14 is positioned on or against the printed circuit board (PCB) 12. Pressure sensitive signal element 16 preferably is a force sensitive resistor, and more specifically a polymer thick film resistor. Other types of force sensitive resistors are also suitable. One type of polymer thick film resistor is commercially available from Eaton Corporation, the assignee of the present invention. The term "pressure sensitive signal element" as used herein is meant to include without limitation any device that is sensitive to a force imparted thereon which establishes a signal indicative thereof and proportional thereto. Another example of such a device is a piezoelectric transducer, or the equivalent.

Figure 3:
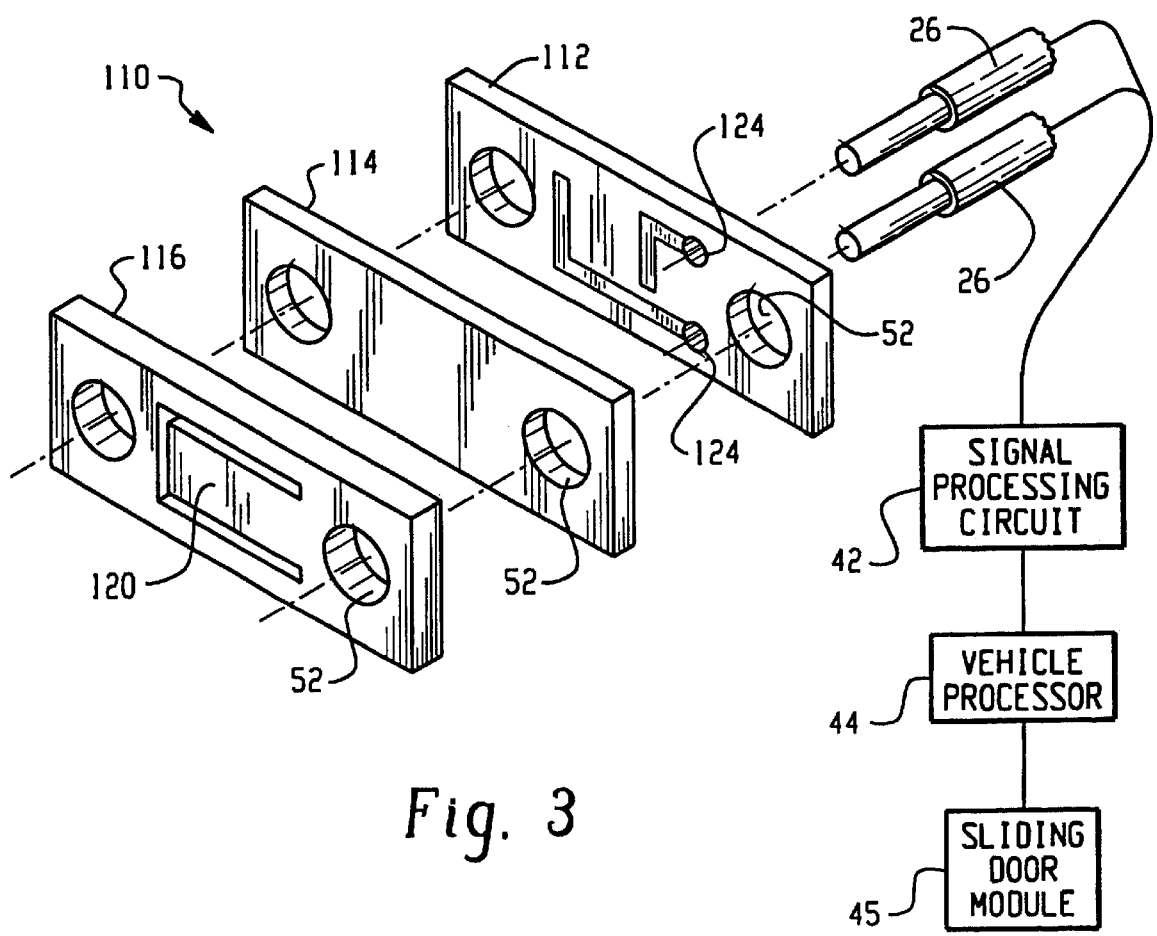
FIG. 3 is an exploded perspective view of still another embodiment of the present invention.

A resiliently deflectable member 18, particularly depicted as a leaf spring in this embodiment, is situated on the PTF layer 14. An actuator 20 such as a plunger or the equivalent is positioned over the resiliently deflectable member 18. Member 18 may either be constructed as a separate piece or constructed to be part of the actuator. The PCB substrate 12 is first positioned in base member 22. Base 22 includes slots 24 to receive wires 26 that are electrically connected to terminals on the printed circuit board and a vehicle processor 44 (as shown in FIG. 3). Of course, while wires are depicted, it is understood that terminals, flex circuit, ribbon cable, etc. are also suitable electrical connectors. Preferably, a signal conditioning circuit 42, which may be contained within processor 44, is included in the electrical arrangement. Processor 44 and signal conditioning circuit 42 are conventional items that are widely commercially available. Vehicle processor 44 is in communication with the door module schematically indicated as 45 which includes the door motor, door clutch, and related hardware. The construction of such a door module 45 is also well known in the art. Returning to FIG. 1, the PTF layer 14 is placed on top or against substrate 12 followed by the resiliently deflectable member 18 and actuator 20. Housing 28 preferably encloses the above components and is joined to the base member 22 with either a sealed or a releasable connection with fasteners, adhesive, welding like ultrasonic welding, heat staking, orbital head forming, or the like. Housing 28 preferably contains an opening 30 constructed to receive a projecting portion 32 of actuator 20 which in FIG. 1 is depicted as a plunger or push button actuator.

Figure 2:
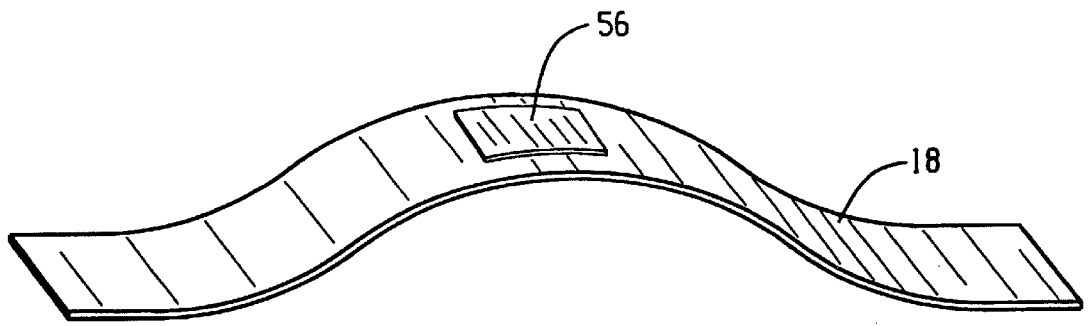
FIG. 2 is a perspective bottom view of another embodiment of the leaf spring in accordance with the present invention.

The resiliently deflectable member 18 preferably comprises a leaf spring which may be a conductor, or alternatively include a portion of a conductor 56 thereon as best seen in FIG. 2 which will be described later in further detail. The leaf spring 18 is preferably made of a metal such as stainless steel, but may also be made of any metal or plastic material. Leaf spring 18 is constructed with a spring force and spring distance sufficient to transform the force applied thereto by actuator 20 into proportional electrical values with the employment of PFT layer 14 and PCB substrate 12. The limit sensor 10 is mounted in a location either on or relative to a moveable element where it will receive a force F imparted on the projecting portion 32 of plunger 20. Alternatively, the sensor may be mounted on the moveable element and receive a force from impact on a stationary element. The plunger travel compresses leaf spring 18 to apply controlled force against the pressure sensitive element 16 against base member 22 which causes a decrease in electrical resistance. The vehicle processor 44 receives an output voltage signal from circuit 42 which then determines the location of the moveable element, for example, if the door is open or closed. The limit sensor 10 depicted in FIG. 1 is preferably constructed to be mounted proximate to a hold open latch with a fastener, welding, adhesive, or the like. Sensor 10 is located on a power sliding door assembly in a manner that angular displacement of the latch pawl 8 depresses plunger 20 when the latch striker on the vehicle body engages the latch.

When the hold open latch rotates to latch the door in place, the extended arm of the latch 8 (or latch pawl or an equivalent) activates or depresses the plunger 20 to change the state of the pressure sensitive signal element, for example, from a resistance of 40 kilohms (kΩ) (open state—no pressure or force on plunger) to 2 kilohms (closed state—plunger is completely depressed). The signal processing circuit 42 will represent this change in preferably an output voltage signal to the vehicle processor 44 which communicates this information to the sliding door module 45.

Of course, alternative arrangements may be made with the limit sensor 10 such as integration of sensor 10 with a hold open cable that functions in a similar manner to latch pawl 8 in imparting a force F for the hold open latch.

In the preferred embodiment, housing 28, base member 22, and actuator 20 are constructed of a plastic material like an acetal plastic material. Leaf spring 18 is constructed of spring steel or stainless steel. PTF layer 14 is a polymer thick film with carbon conductor. As previously mentioned, substrate 12 may either be a printed circuit board, an ink film printed impression, silk screen, or simply be conductive strips that terminate in two electrical leads or terminals.

In a power sliding door system, sensor 10 preferably should be inactive or open when the door is closed. When the vehicle door is open, preferably the sensor 10 remains active even when the vehicle door is about 10 to about 12 mm from the C-pillar. The term C-pillar is an automotive term of art which refers to the vehicle's frame or body portion behind the rear door. In a vehicle, there are A, B, C, and D-pillars. The A-pillar refers to the portion up to the windshield, the B-pillar is that portion behind the front door. The C-pillar is described above. The D-pillar is the portion of framing for the rear window.

Referring next to FIG. 2, there is shown an alternate embodiment of the leaf spring 18. A conductive layer of material 56 is selectively positioned on leaf spring 18. Leaf spring 18 is made of a nonconductive material and only portion 56 is conductive. Preferably, the conductive layer 56 is positioned fairly centrally on leaf spring 18 over a predetermined portion or area. In this manner, layer 14 may be eliminated. Alternatively, leaf spring 18 may be made of conductive material or have a conductive layer thereon, but employ an isolator material (nonconductive) that separates conductors. These embodiments allow layer 14 to be eliminated from the sensor. When the leaf spring 18 is made of nonconductive material like plastic, the conductive portion 56 may be placed thereon with a silk screen process. If leaf spring 18 is made of metal, then an insulative material must be put on first. Portion 56 is placed in a location that contacts the force sensing resistor 12.

Turning now to FIG. 3, there is shown still another embodiment of the sensor generally designated 110 according to the present invention. Sensor 110 comprises a substrate 112 with a force sensing resistor such as a printed circuit, conductive strips, or equivalent similar to PCB 12. Substrate 112 is preferably constructed to be sufficiently rigid to also function as a base member for providing support. A PTF layer 114 is positioned against the substrate 112 and then cover 116. Cover 116, PTF layer 114, and substrate 112 may contain one or more aligned openings 52 to receive fasteners (not shown) to secure the components of sensor 110. Wires 26 or equivalents as previously described are preferably connected to the printed circuit on substrate 112 by terminals or the like. Wires 26 or electrical connectors pass through optional openings 124 therein. Cover 116 is constructed with a cantilever 120 positioned to receive a force from a moveable element and to transfer the force applied thereto to the substrate 112 through the PTF layer 114. As mentioned previously, sensor 110 may be mounted to the moveable element, in which case cantilever 120 receives a force from a stationary element as the moveable element makes impact thereon. In this manner, the force is transformed into a proportional electrical value. Cantilever 120 is located proximate the moveable element in a manner similar to that of sensor 10. Cantilever 120 may be integrated within the cover 116 as shown, or be a separate member, and is actuated by a latch pawl, cam or equivalent.

Figure 5:
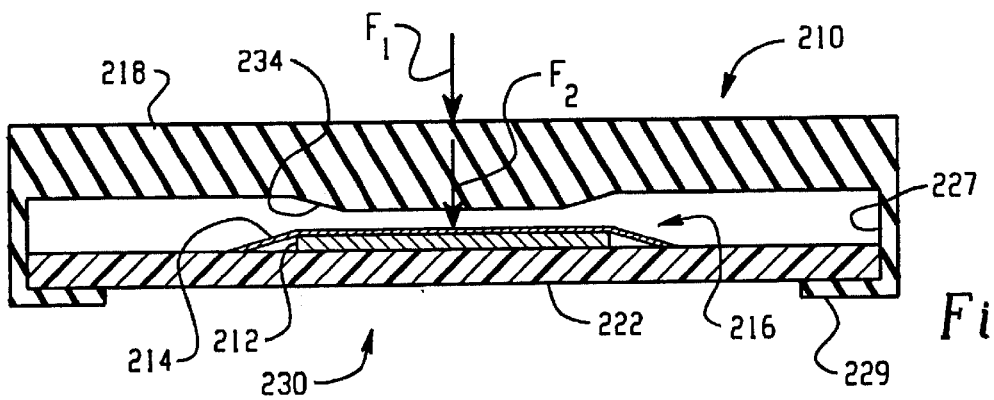
FIG. 5 is a sectional view of still another embodiment of the sensor in accordance with the present invention.
Figure 6:
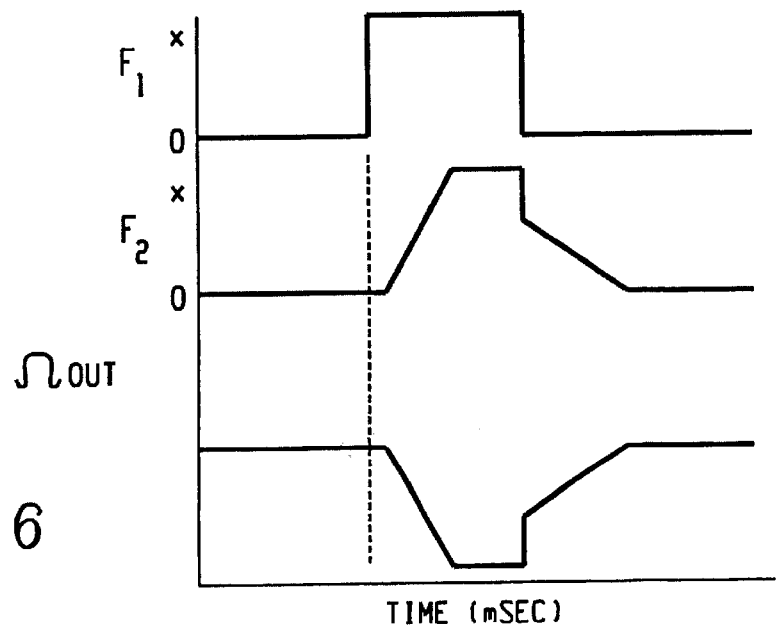
FIG. 6 is a graph of resistance and force (F1, F2) versus time (msec) for the sensor in FIG. 5.

Referring next to FIGS. 5 and 6, there is depicted still another embodiment of the sensor generally designated 210 according to the present invention. In this embodiment, the base member 222 is contained within an elastic material, like rubber, housing 218 which preferably has a cup or dish-like configuration that forms a cavity in which the pressure sensitive signal element 216 and base member 222 are contained. The pressure sensitive element 216 includes the substrate 212 with a force sensitive resistor or a PCB situated thereon covered with a PTF layer 214. The housing 218 in this embodiment functions as the actuator and the resiliently deflectable member and is preferably a nitrile rubber material with a snap-in design as shown in FIG. 5. The rubber material may be rubber, or elastic material with a durometer value ranging between about 40 to about 95 Shore A, with about 60 Shore A value preferred. Suitable materials include natural rubber, and thermoplastic elastomers. A thermoplastic elastomer is preferably used in an overmolding process or design which is an alternative embodiment to the snap-in design shown in FIG. 5. The housing 218 includes internal side walls 227 with a rim 229 that extends inwardly radially around opening 230. Rim 229 assists in securing the components within housing 218 for the snap-in design. Alternatively, housing 218 may be constructed of any material as long as the upper portion has a resiliently deflectable member. Housing 218 may even be molded over the pressure sensitive signal element 216 and base member 222.

Housing 218 preferably includes a projection 234 fairly centrally located within the cavity formed by the side walls 227 of housing 218 and positioned over the pressure sensitive signal element 216. Projection 234 is spaced at a distance from the pressure sensitive signal element 216 so as to direct force $F_1$ as indicated by the arrow through force $F_2$ to represent the rubber dampening to substantially the center of the pressure sensitive element 216. Advantageously, the elastic material 218 effectively increases the length of time the impact transfers the force to the pressure sensitive signal element as illustrated in FIG. 6. In FIG. 6, the resistance (Ω out) is shown decreasing directly proportional to the amount of force. $F_1$ represents the force velocity in Newtons (N) from an initial point designated zero to some parameter designated x. The x parameter represents a random velocity for a known weight. $F_2$ represents the force velocity transferred to the elastic material 218 at the same parameters. The vertical dashed line in the graph shows the delay of $F_2$ from $F_1$ caused by the distance between projection 234 and pressure sensitive signal element 216. The initial or front slope in the plot of $F_2$ is a function of the compressibility of the elastic material until it reaches a maximum that corresponds to the maximum force of $F_1$. The compressibility of the elastic material produces a dampening effect as the force is released as evidenced by the slope that follows the release of the force. The memory of the rubber material increases the signal response time without the necessity of additional circuitry or other components. This eliminates the need for additional electrical circuitry or logic by maintaining a force for a time sufficient for a vehicle processor to detect a signal. The memory of the rubber material acts as a pulse stretcher for a pulsed voltage signal.

Sensor 210 finds particular applicability as a bumper design sensor, for example, as a sliding door stop where the sensor 210 senses that the door is stopped at the end of its travel. The force of the door as indicated by arrow $F_1$ impacts the pressure sensitive signal element as $F_2$ due to the dampening effect of the rubber and generates a time delayed output signal therefrom. Sensor 210 may be mounted to the door, or alternatively be located on the C-pillar with fasteners, welding, adhesive, mechanical interference fit, press fit, or the like.

Either sensor 10 or 110 finds particular utility in a sliding door hold open latch. The sensor becomes active when the door approaches to within a set distance in the selected path of travel, for example, approximately 10 to approximately 12 millimeters of the C-pillar in a mini-van. The vehicle processor 44 senses the vehicle door is opening and proceeds to latch it open at the end of travel. If the sensor was inactive, the vehicle processor assumes the door is closed, and then opens it which will reactivate the sensor at its end of travel and latch it open again. One of the primary benefits of the present invention is it assures the end-of-travel (EOT) latch engages which prevents operator aggravation as noted earlier and may also reduce excessive and needless wear on the door module and related hardware.

Normally, there is a vehicle system requirement that the end of travel (EOT) sensor has a selected distance of say approximately 10 to 12 millimeters travel distance of activation in a mini-van, because of potential door rebound. This means that the sensor should stay active while the sliding door reaches a selected station or distance from the C-pillar. The vehicle processor does not know where the door is at when the EOT switch is not active. During a power sliding door "open" operation, the vehicle processor turns on the door module (that is the motor and clutch) to drive the door to a fully "open" position as detected by the limit sensor. When the limit sensor is activated by force on the sensor against the C-pillar, the vehicle processor engages the hold open latch. The limit sensor of the present invention remains active, unlike other end of travel switches. A holding latch will then hold the door at this position. When the operator wishes to close the sliding door, the operator presses one of the command switches on the overhead console, or the interior manual push button on door, or lifts the exterior door latch, or the like. Since the vehicle processor now knows where the sliding door is at, the processor will instruct the module to immediately close the sliding door. In contrast to the prior art switches, the limit sensor 10, 110 of the present invention remains active. This results in assuring EOT latch engagement.

Normally, a power sliding door closes at about three to four feet per second. If the door is used in the manual mode, speed of opening can be as great as about six to about seven feet per second, and even as great as about ten feet per second. These speeds are considered harsh or abusive. Existing technology using conventional switches resulted in an electrical signal with a duration of 1 millisecond or less. The processor is not capable of reading such a short signal. The limit sensor of the present invention allows for a clear voltage transmission from approximately 6.0 volts to approximately 2.0 volts, or a resistive transmission from about 40 k$\Omega$ to about 2$\Omega$ and stretches the time period to about 20 to about 30 milliseconds (msec.). The waveform looks very much like a square wave for the 20 to 30 msec. Advantageously, sensor 210 provides a longer signal than a mechanical jamb/limit switch due to the dampening effect of the rubber material. This provides enough time for the system to react.

The sensor according to the present invention is capable of transforming an applied force into proportional electrical values. It is suitable for use as a multi-function switching device, eliminating traditional electrical contacts, and separating the electrical and mechanical functions in automotive switches. The pressure sensitive signal element contained therein along with a simple voltage-divider circuit provides an output voltage directly related to the applied force.

While specific embodiments of the invention have been shown and described in detail to illustrate the application of the principles of the invention, it will be understood that the invention may be embodied otherwise without departing from such principles.

We claim:

1. An improved limit sensor for a vehicle power sliding door assembly having an increased signal response time, comprising:

a housing;

an actuator disposed within said housing and being constructed to receive a force from a movable element of the vehicle power sliding door assembly, said actuator having a deflectable member with a selected resiliency; and a pressure sensitive signal element situated within said housing against said deflectable member and being electrically responsive thereto, said pressure sensitive signal element receiving the force imparted from said deflectable member of said actuator and establishing a signal indicative thereof, said selected resiliency of said deflectable member producing a dampening effect for increasing a length of time for signal response for facilitating operation of the vehicle power sliding assembly by increasing signal response time.

2. A sensor as recited in claim 1, wherein said housing is joined to a base member, said base member supporting said pressure sensitive signal element, said housing surrounding said pressure sensitive signal element and having said deflectable member with said selected resiliency positioned on said pressure sensitive signal element.

3. A sensor as recited in claim 1, wherein said selected resiliency of said deflectable member comprises an elastic material having a compressibility constructed to produce the dampening effect.

4. A sensor as recited in claim 3, wherein said elastic material comprises a rubber material.

5. A sensor as recited in claim 4, wherein said rubber material forms said housing surrounding said pressure sensitive signal element.

6. A sensor as recited in claim 5, wherein an inner surface of said housing is positioned at a distance from said pressure sensitive signal element.

7. A sensor as recited in claim 6, wherein said inner surface further comprises a projection spaced from said pressure sensitive signal element.

8. A sensor as recited in claim 1, wherein said signal is a pulsed signal.

9. A sensor as recited in claim 8, wherein said selected resiliency of said deflectable material provides an increased duration in the pulsed signal.

10. A sensor as recited in claim 1, further comprising a housing formed of a rubber material, said housing having an inverted cup-like configuration with said pressure sensitive signal element, and said base member positioned therein.

11. A sensor as recited in claim 10, wherein said housing includes a rim extending radially inwardly about a perimeter of said base member.

12. A method for increasing signal response time for a limit sensor, comprising the steps of:

providing an actuator having a deflectable member with a selected resiliency, the deflectable member of the actuator being constructed to receive a force from a movable element;

providing a pressure sensitive signal element and positioning the pressure sensitive signal element at a selected location for receiving the force from the deflectable member of the actuator;

providing a base member for supporting the pressure sensitive signal element and the deflectable member of the actuator;

generating a signal with the pressure sensitive signal element substantially proportional to the force imparted from the deflectable member of the actuator on the pressure sensitive signal element;

producing a dampening effect following a release of the force with the selected resiliency of the deflectable member of the actuator; and increasing a length of time for the signal with the dampening effect produced by the selected resiliency of the deflectable member of the actuator to allow sufficient time for detection of the signal from the limit sensor.

13. A method as recited in claim 12, further comprising the steps of transmitting the signal to a processor, and providing a control signal to a device responsive to the signal from said pressure sensitive signal element.

14. A method as recited in claim 12, further comprising the step of overmolding an elastic material for forming the actuator and the deflectable member with the selected resiliency on the pressure sensitive signal element and base member.

15. A method as recited in claim 13, wherein the producing step comprises the step of pulse stretching a pulsed voltage signal with the dampening effect of the deflectable member made of a rubber material.

16. A method as recited in claim 12, further comprising the step of positioning a housing on the pressure sensitive signal element and the deflectable member of the actuator on the base member.

17. A method as recited in claim 12, wherein the moveable element is a vehicle door.

18. A method as recited in claim 16, wherein the deflectable member with the selected resiliency is made from a rubber material and comprises the housing.

19. An improved limit sensor, comprising:

an actuator constructed to receive a force from a movable element, said actuator being positioned on a selected path of movement, said actuator having a deflectable member having a selected resiliency;

a pressure sensitive signal element operatively connected to said deflectable member of said actuator for receiving the force imparted therefrom and establishing a signal indicative thereof; and a base member connected to said actuator and said pressure sensitive signal element for supporting said actuator, said deflectable member, and said pressure sensitive signal element, said deflectable member having said selected resiliency being constructed to activate with the transfer of the force said pressure sensitive signal element at a predetermined station along the selected path of movement, said selected resiliency of said deflectable member producing a dampening effect as the force is released for increasing the signal response time for a time sufficient for detection of the signal.

20. A limit sensor as recited in claim 19, further comprising a housing joined to said base member, and said housing surrounding said pressure sensitive signal element.

21. A limit sensor as recited in claim 20, wherein said deflectable member comprises a leaf spring having a selected resiliency situated between said actuator and said pressure sensitive element.

22. A limit sensor as recited in claim 21, wherein said leaf spring is constructed of a nonconductive material and has a conductive portion of a predetermined size and location thereon.

23. A limit sensor as recited in claim 22, wherein said actuator comprises a lunger.

24. A limit sensor as recited in claim 21, wherein said actuator comprises a cantilever.

25. A limit sensor as recited in claim 24, wherein said cantilever comprises a portion of a cover constructed for attachment to said base member.

26. A limit sensor as recited in claim 21, wherein said leaf spring is constructed of a conductive material and includes a conductive portion situated at a selected location and having a predetermined size, said conductive portion being isolated with an insulator from said conductive material of said leaf spring.

27. A limit sensor as recited in claim 21, wherein said leaf spring is constructed of a conductive material.

* * * * *